(12) United States Patent
Kadavelugu et al.

(10) Patent No.: US 11,695,405 B2
(45) Date of Patent: Jul. 4, 2023

(54) SHORT CIRCUIT PROTECTION FOR SEMICONDUCTOR SWITCHES

(71) Applicant: ABB Schweiz AG, Baden (CH)

(72) Inventors: Arun Kadavelugu, Raleigh, NC (US); Eddy Aeloiza, Apex, NC (US)

(73) Assignee: ABB Schweiz AG, Baden (CH)

( * ) Notice: Subject to any disclaimer, the term of this patent is extended or adjusted under 35 U.S.C. 154(b) by 101 days.

(21) Appl. No.: 16/444,343

(22) Filed: Jun. 18, 2019

(65) Prior Publication Data
US 2020/0403608 A1 Dec. 24, 2020

(51) Int. Cl.
| | | |
|---|---|---|
| H02H 9/00 | (2006.01) | |
| H03K 17/082 | (2006.01) | |
| H02H 7/20 | (2006.01) | |
| H01L 29/20 | (2006.01) | |
| H01L 29/16 | (2006.01) | |

(52) U.S. Cl.
CPC .......... *H03K 17/082* (2013.01); *H02H 7/205* (2013.01); *H01L 29/1608* (2013.01); *H01L 29/2003* (2013.01)

(58) Field of Classification Search
CPC ............. H03K 17/082; H03K 17/0822; H03K 17/0828; H02H 7/205
USPC ................................ 361/56, 91.1, 93.1, 93.9
See application file for complete search history.

(56) References Cited

U.S. PATENT DOCUMENTS

| | | | |
|---|---|---|---|
| 4,937,694 A * | 6/1990 | Weber ................. | G01D 5/2415 29/25.42 |
| 5,764,466 A | 6/1998 | Mangtani et al. | |
| 10,024,887 B2 | 7/2018 | Trescases et al. | |
| 2015/0098258 A1* | 4/2015 | Park ..................... | H02H 7/1225 363/37 |
| 2015/0155863 A1* | 6/2015 | Takasu ............... | H03K 17/0412 327/108 |

(Continued)

OTHER PUBLICATIONS

Avago Technologies, "HCPL-316J: 2.5 Amp Gate Optocoupler with Integrated (VCE) Desaturation Detection and Fault Status Feedback," Product Data Sheet, dated Mar. 9, 2015, 32 pp., Broadcom Inc., San Jose, USA.

(Continued)

*Primary Examiner* — Jared Fureman
*Assistant Examiner* — Lucy M Thomas
(74) *Attorney, Agent, or Firm* — Leydig, Voit & Mayer, Ltd.

(57) ABSTRACT

Systems, methods, techniques and apparatuses of a semiconductor control system are disclosed. One exemplary embodiment is a method for protecting a semiconductor switch comprising receiving a first voltage during a second blanking period following a first blanking period; determining whether a short circuit fault is occurring by comparing the first voltage to a fast detection threshold corresponding to a first value of a drain-source voltage of the semiconductor switch; if a short circuit is not occurring: receiving a second voltage after the second blanking period ends; determining whether a short circuit fault is occurring by comparing the second voltage to a slow detection threshold corresponding to a second value of the drain-source voltage; and if a short circuit fault is occurring, opening the semiconductor switch, wherein the first value of the drain-source voltage is greater than the second value of the drain-source voltage.

19 Claims, 5 Drawing Sheets

(56) References Cited

U.S. PATENT DOCUMENTS

2018/0304829 A1* 10/2018 Yanagawa ............ H03K 17/223

OTHER PUBLICATIONS

R. Singh et al., "Short Circuit Robustness of 1200 V SiC Switches," 2015 IEEE 3rd Workshop on Wide Bandgap Power Devices and Applications (WiPDA), dated Jan. 4, 2016, 4 pp., IEEE, Piscataway, USA.

H. Li et al., "E-mode GaN HEMT Short Circuit Robustness and Degradation," 2017 IEEE Energy Conversion Congress and Exposition (ECCE), dated Nov. 7, 2017, pp. 1995-2002, IEEE, Piscataway, USA.

Avago Technologies, "ACPL-31 JT: Automotive 2.5 Amp MOSFET Gate Drive Optocoupler with Integrated Desat Over Current Sensing, Miller Current Clamping and Under Voltage Lock-Out Feedback," Product Data Sheet, dated Mar. 3, 2015, 21 pp., Broadcom Inc., San Jose, USA.

J. Wang et al., "Design of a High-Bandwidth Rogowski Current Sensor for Gate-Drive Shortcircuit Protection of 1.7 kV SiC MOSFET Power Modules," 2015 IEEE 3rd Workshop on Wide Bandgap Power Devices and Applications (WiPDA), dated Jan. 4, 2016, pp. 104-107, IEEE, Piscataway, USA.

B. Wittig et al., "Analysis and Design Aspects of a Desaturation Detection Circuit, for Low Voltage Power MOSFETs," Proceedings of 14th International Power Electronics and Motion Control Conference EPE-PEMC 2010, dated Oct. 21, 2010, pp. T1-7-T1-12, IEEE, Piscataway, USA.

Z. Wang et al., "Design and Performance Evaluation of Overcurrent Protection Schemes for Silicon Carbide (SiC) Power MOSFETs," IEEE Transactions on Industrial Electronics, dated Oct. 2014, pp. 5570-5581, vol. 61, No. 10, IEEE, Piscataway, USA.

D. Sadik et al., "Analysis of Short-Circuit Conditions for Silicon Carbide Power Transistors and Suggestions for Protection," 2014 16th European Conference on Power Electronics and Applications, dated Sep. 29, 2014, 10 pp., IEEE, Piscataway, USA.

P. Liu et al., "High Bandwidth Current Sensing of SiC MOSFET with a Si Current Mirror," 2016 IEEE 4th Workshop on Wide Bandgap Power Devices and Applications (WiPDA), dated Dec. 29, 2016, pp. 200-203, IEEE, Piscataway, USA.

Y. Seki et al., "A New IGBT with a Monolithic Over-Current Protection Circuit," Proceedings of the 6th International Symposium on Power Semiconductor Devices and Ics, dated Aug. 6, 2002, pp. 31-35, IEEE, Piscataway, USA.

Infineon, "High speed DuoPack: IGBT in Trench and Fieldstop technology with soft, fast recovery anti-parallel diode," IKW25N120H3 Industrial Power Control Datasheet, dated Dec. 1, 2014, 17 pp., vol. 2, No. 1, Infineon Technologies AG, Munich, Germany.

A. Kadavelugu et al., "Short-circuit Performance of Multi-chip SiC MOSFET Modules," 2017 IEEE 5th Workshop on Wide Bandgap Power Devices and Applications (WiPDA), Dated Dec. 11, 2017, pp. 285-290, IEEE, Piscataway, USA.

E. Aeloiza et al., "An Experimental Demonstration of Short Circuit Protection of SiC Devices," Materials Science Forum, dated Feb. 26, 2018, pp. 818-821, vol. 924, Trans Tech Publications Ltd., Zurich, Switzerland.

* cited by examiner

SHORT CIRCUIT PROTECTION FOR SEMICONDUCTOR SWITCHES

BACKGROUND

The present disclosure relates generally to short circuit protection. Wide bandgap semiconductor switches are becoming increasingly more common in power electronic applications such as motor drive units, to name but one example. While wide bandgap switches offer very high switching frequencies and low switching losses, they are more susceptible to short circuit currents than other semiconductor switches. For example, many wide bandgap devices only tolerate short circuit currents for less than 1 us. Existing semiconductor control circuits suffer from a number of shortcomings and disadvantages. There remain unmet needs including increasing fault response, reducing short circuit current peaks, and increasing reliability. For instance, conventional short circuit detection circuits may delay detection by 2 us or more to avoid false detection. For short circuit faults caused by a load fault, the inductance of the circuit may delay the rise in current enough for a conventional short circuit detection circuit to protect a wide bandgap semiconductor switch. However, a conventional short circuit detection circuit will not respond to low inductance short circuit faults, such as phase leg faults, in time to prevent damage to a wide bandgap semiconductor switch. Furthermore, the delay added to the detection process allows the current more time to spike, causing stress on any semiconductor switch when turned off. In view of these and other shortcomings in the art, there is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY OF THE DISCLOSURE

Exemplary embodiments of the disclosure include unique systems, methods, techniques and apparatuses for semiconductor switch short circuit protection. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
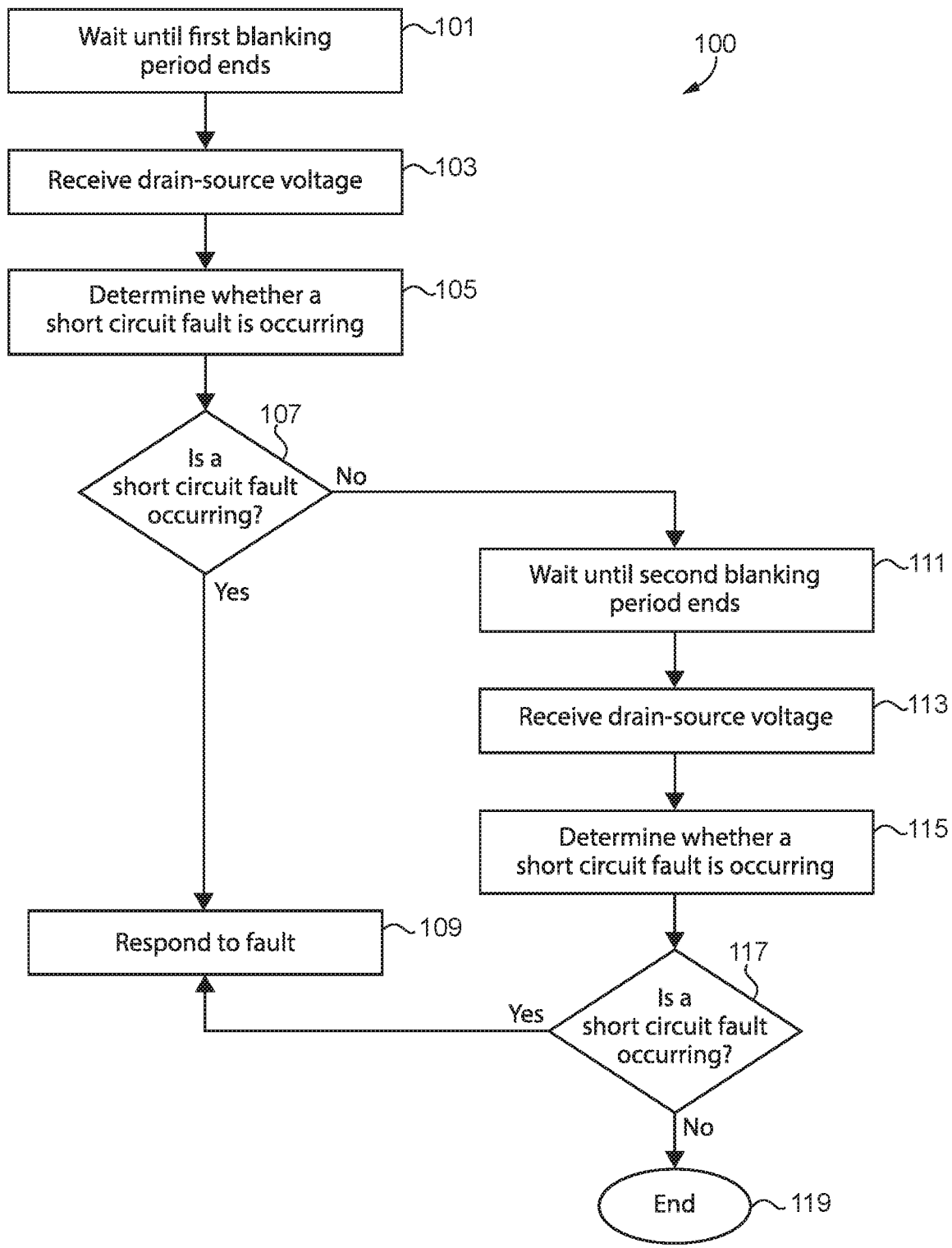
FIG. 1 illustrates an exemplary process for semiconductor switch short circuit protection.

With reference to FIG. 1, there is illustrated an exemplary process 100 for detecting a short circuit fault current flowing through a semiconductor switch while the semiconductor switch is turned on or in the process of being turned on. Process 100 may be implemented by the semiconductor control circuits disclosed herein. In certain forms, the phase leg fault detection and load short circuit fault detection functionalities may be performed by separate detection circuits of the semiconductor control circuits. In certain forms, the phase leg fault detection and load fault detection functionalities may be performed by the same detection circuit. It shall be further appreciated that a number of variations and modifications to process 100 are contemplated including, for example, the omission of one or more aspects of process 100, the addition of further conditionals or operations, or the reorganization or separation of operations and conditionals into separate processes.

Process 100 begins at operation 101 where a fast fault detection circuit waits for a first blanking period beginning when a gate driver first applies an increasing gate voltage to a gate of the semiconductor switch. The first blanking period ends when the semiconductor switch is turned on. In certain embodiments, the semiconductor switch is considered turned on once the Miller capacitance between the drain and gate of the semiconductor switch is discharged. In certain embodiments, the semiconductor switch is considered turned on once current begins to flow from the drain to the source of the semiconductor switch. In certain embodiments, the first blanking period is extended by a time period, such as 100 ns or less, after the semiconductor switch is turned on to increase the accuracy of the determination in operation 105.

In certain embodiments, the semiconductor switch is a wide bandgap device, such as a silicon carbide (SiC) switch or a gallium nitride (GaN) switch, to name but a few examples. In certain embodiments, the semiconductor is an insulated gate bipolar transistors (IGBTs), another bipolar semiconductor switch, or another type of silicon based semiconductor switch.

Process 100 proceeds to operation 103 where a fast detection circuit receives a voltage corresponding to the voltage across the drain and source of the semiconductor switch, also known as a drain-source voltage, during a second blanking period immediately following the first blanking period. The second blanking period begins once the semiconductor switch is turned on.

Process 100 proceeds to operation 105 where the fast detection circuit determines whether a phase leg short circuit is occurring. The voltage received in operation 103 is compared to a fast detection threshold voltage. The value of the fast detection threshold voltage corresponds to a value of the drain-source voltage of the semiconductor switch.

In certain embodiments, the fast detection circuit receives a voltage corresponding to the drain-source voltage during the first blanking period instead of waiting during operation 101. The fast detection circuit then determines whether a phase leg short circuit fault is occurring by comparing the received voltage to a third detection threshold voltage corresponding to a value of the drain-source voltage of the semiconductor switch. The third detection threshold voltage is greater than the fast detection threshold voltage. For example, half-way through the first blanking period, the fast detection circuit may receive a drain-source voltage. If the received drain-source voltage is greater than 80% of the present blocking voltage of the semiconductor switch, the fast detection circuit will determine a short circuit fault is occurring and process 100 will proceed to operation 109. In certain embodiments, multiple voltages are received during the first blanking period by the fast detection circuit which compares each received voltage to one of multiple threshold voltages, each of the multiple threshold voltages being less than a previously compared threshold voltage but greater than the fast detection threshold voltage.

A phase leg short circuit fault may be a short circuit fault occurring in a drive unit or power electronic device which incorporates the semiconductor switch. Phase leg short circuits include a low inductance compared to a load short circuit fault, meaning the rate of change in current, instantaneous voltage, and power dissipation are all greater for phase leg short circuits than load short circuits. A phase leg short circuit fault may be a fault having a current path with an inductance less than 100 nH, while a load short circuit fault may be a fault having a current path greater than 200 nH. A phase leg short circuit fault may be caused by a malfunction of a semiconductor switch, a failure of a semiconductor switch, or an unintentional connection between two points in a circuit by a conductive material. A load short circuit fault is caused by a change in the impedance or resistance of a load that causes load current to increase beyond the rated current capacity of the system.

In certain embodiments, the fast detection threshold voltage corresponds to a drain-source voltage of at least 5% of the blocking voltage of the semiconductor switch, or at least 5 times greater than the slow detection threshold, as discussed below. In certain embodiments, fast detection threshold voltage corresponds to a drain-source voltage of at least 100 V.

Process 100 proceeds to conditional 107. If the fast detection circuit determines a phase leg short circuit is occurring, process 100 proceeds to operation 109 where the semiconductor control system responds to the phase leg short circuit fault. In certain embodiments, a gate driver of the semiconductor control system responds to a detected fault by opening the semiconductor switch. In certain embodiments, responding to the phase leg short circuit fault may include transmitting a fault signal to a power converter controller or transmitting an alert to a user. In certain embodiments, the fast detection circuit determines a phase leg short circuit is occurring within 300 ns of the beginning of the first blanking period.

In certain embodiments, opening the semiconductor switch occurs within 1 us of the beginning of the first blanking period. In certain embodiments, opening the semiconductor switch occurs within 0.25 us of the beginning of the first blanking period.

If the fast detection circuit does not determine a phase leg short circuit fault is occurring, process 100 proceeds to operation 111 where a slow detection circuit waits until the second blanking period ends. In some embodiments, second blanking period may last for a duration of 500 ns, to give but one example. While the addition of a second blanking period delays the fault response time, the duration of the second blanking period is configured so as to reduce or eliminate noise, also known as voltage ringing, in the fault detection circuit to prevent erroneous fault detection and response. In certain embodiments, the second blanking period is longer than the first blanking period. In certain embodiments, the second blanking period is between 1 us and 2.8 us. In certain embodiments, the second blanking period is based on thermal ratings of the semiconductor switch.

Process 100 proceeds from operation 111 to operation 113 where the slow detection circuit receives a voltage corresponding to the drain-source voltage of the semiconductor switch following the second blanking period.

Process 100 proceeds to operation 115 where the slow detection circuit determines whether a load short circuit fault is occurring. The voltage received in operation 113 is compared to a slow detection threshold voltage. The value of the slow detection threshold voltage corresponds to a value of the drain-source voltage of the semiconductor switch. In certain embodiments, the slow detection threshold voltage corresponds to a drain-source voltage between 5-7V, to name but one example.

Process 100 proceeds to conditional 117. If the slow detection circuit determines a load short circuit fault is occurring, process 100 proceeds to operation 109 where the semiconductor control circuit responds to the fault as described above. If the slow detection circuit does not determine a load short circuit fault is occurring, process 100 proceeds to end operation 119.

Figure 2:
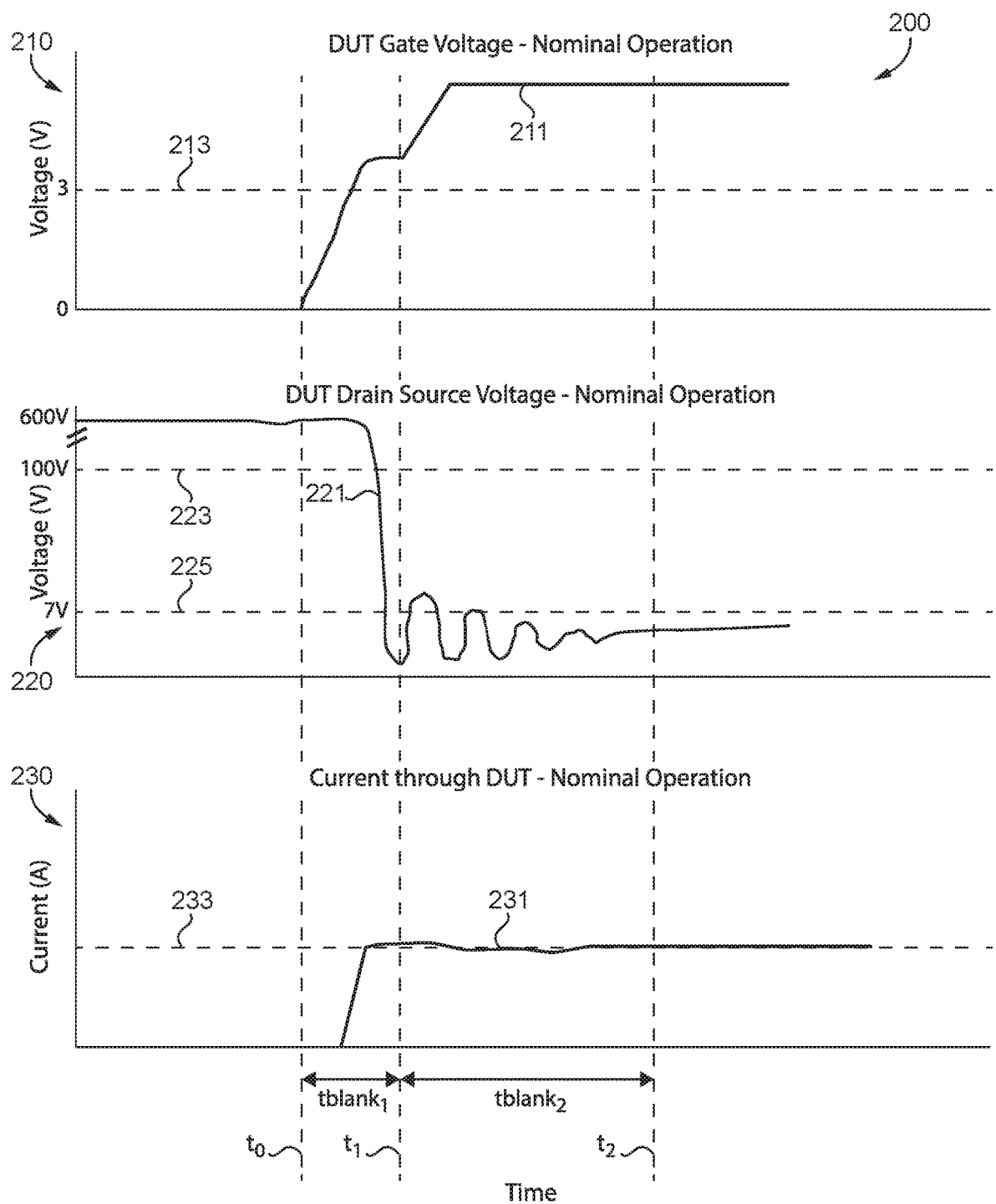
FIGS. 2-4 are graphs illustrating electrical characteristics of a semiconductor switch protected by an exemplary semiconductor control circuit.
Figure 3:
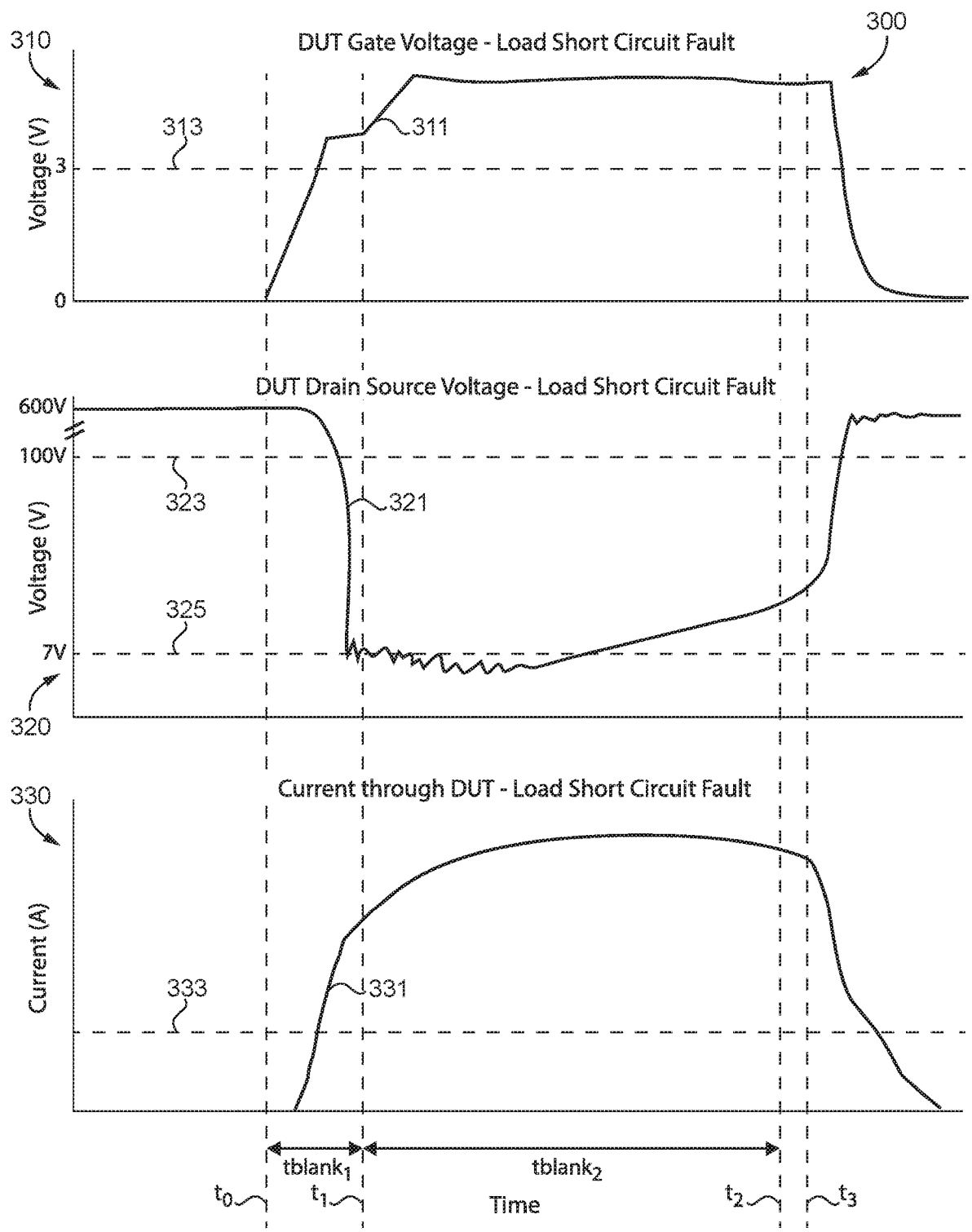
Figure 4:
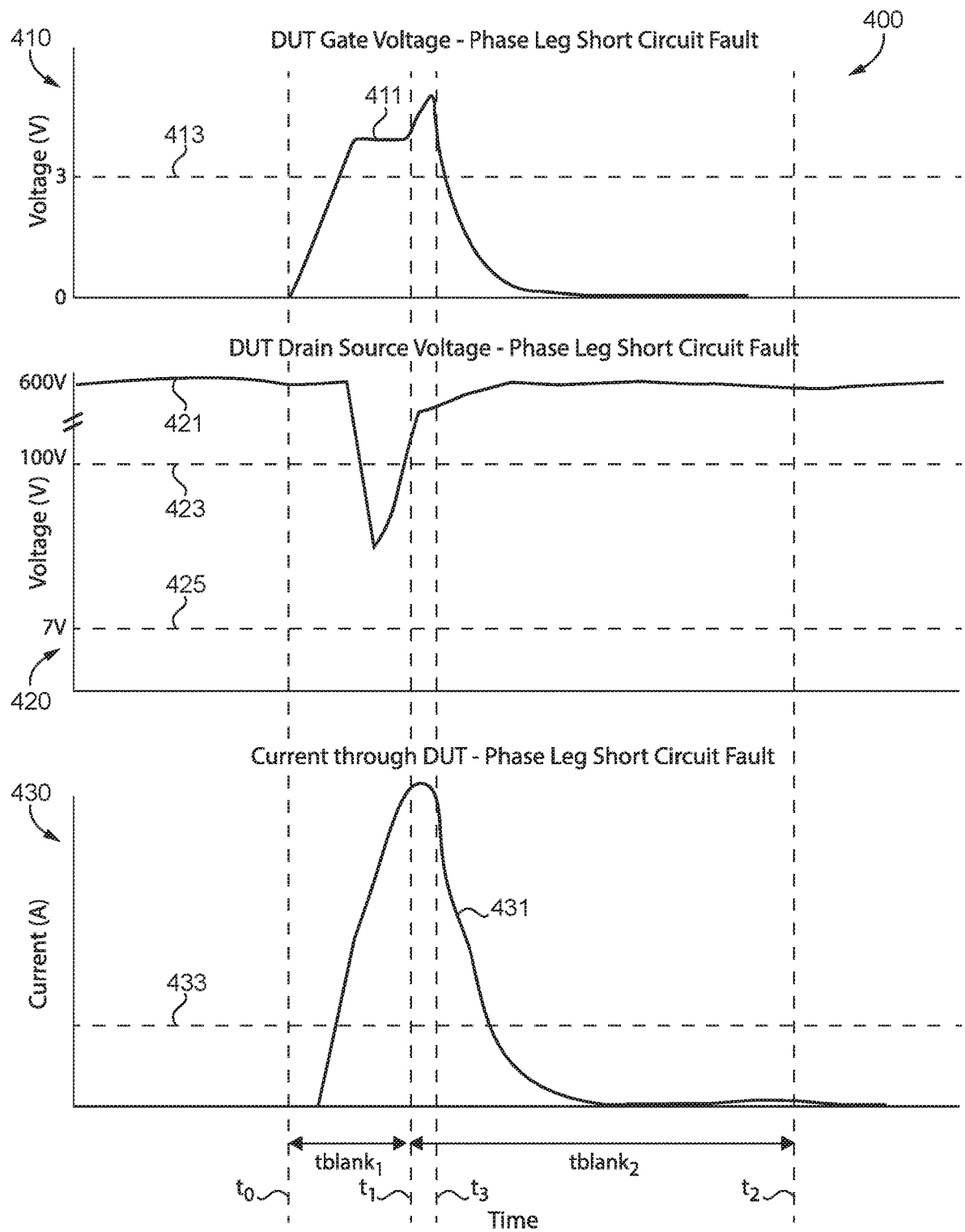

With reference to FIGS. 2-4, there are a plurality of graphs illustrating electrical characteristics of a semiconductor switch protected by an exemplary semiconductor control system using exemplary process 100 in FIG. 1. The plurality of graphs illustrate electrical characteristics during a first blanking period from $t_0$ to $t_1$, and a second blanking period from $t_1$ to $t_2$. The plurality of graphs include a gate voltage threshold, a fast detection threshold, and a slow detection threshold. The gate voltage threshold represents the minimum value of voltage applied at the gate of the semiconductor to allow current to begin to flow through the semiconductor switch. After the gate voltage threshold is exceeded by the gate voltage, the gate voltage experiences the Miller plateau, during which drain-source voltage begins to decrease and the Miller capacitance discharges. In the illustrated graphs, the semiconductor switch is considered turned on at the end of the Miller plateau, when the Miller capacitance is fully discharged. The fast detection threshold is a value of drain-source voltage configured to be compared to the drain-source voltage with the fast detection circuit after the first blanking period in order to determine a short circuit fault is occurring while avoiding a false fault detection. The slow detection threshold is a value of drain-source voltage configured to be compared to the drain-source voltage with the slow detection circuit after the second blanking period in order to determine a short circuit fault is occurring while avoiding a false fault detection.

With reference to FIG. 2, there is a plurality of graphs 200 illustrating electrical characteristics of a semiconductor switch during nominal operation where no short circuit fault is occurring. The plurality of graphs 200 includes graph 210 illustrating gate voltage, graph 220 illustrating drain-source voltage, and graph 230 illustrating current. Graph 210 includes a line representing gate voltage 211 and a gate voltage threshold 213. Graph 220 includes a line representing drain-source voltage 221, a fast detection voltage threshold 223, and a slow detection threshold 225. Graph 230 includes a line representing current 231 and a nominal current magnitude 233.

At $t_0$, a gate driver begins to apply an increasing gate voltage 211 to the semiconductor switch. Once gate voltage 211 exceeds gate voltage threshold 213, current 231 begins to increase. Once gate voltage 211 reaches the Miller plateau, drain-source voltage 221 begins to decrease, and the Miller capacitance begins to discharge. At $t_1$, the Miller capacitance is fully discharged. After $t_1$, drain-source voltage 221 includes noise causing the drain-source voltage to temporarily exceed slow detection threshold 225. During the period of time between $t_1$ and $t_2$, the noise in the drain-source voltage dissipates, and the drain-source voltage settles under the slow detection threshold 225. At $t_2$, the second blanking period ends and the drain-source voltage is below slow detection threshold 225.

With reference to FIG. 3, there is a plurality of graphs 300 illustrating electrical characteristics of a semiconductor switch during a load short circuit fault. The plurality of graphs 300 includes graph 310 illustrating gate voltage, graph 320 illustrating drain-source voltage, and graph 330 illustrating current. Graph 310 includes a line representing gate voltage 311 and a gate voltage threshold 313. Graph 320 includes a line representing drain-source voltage 321, a fast detection threshold 323, and a slow detection voltage threshold 325. Graph 330 includes a line representing current 331 and a nominal current magnitude 333.

At $t_0$, a gate driver begins to apply an increasing gate voltage 311 to the semiconductor switch. Once gate voltage 311 exceeds gate voltage threshold 213, current 331 begins to increase. Once gate voltage 311 reaches the Miller plateau, drain-source voltage 321 begins to decrease and the Miller capacitance begins to discharge. Before $t_1$, drain-source voltage 321 is less than fast detection threshold 323. At $t_1$, the Miller capacitance is fully discharged. After $t_1$, drain-source voltage 321 includes noise causing drain-source voltage 321 to temporarily exceed the slow detection threshold 325. During the second blanking period, the noise in drain-source voltage 321 dissipates, but drain-source voltage 321 increases above slow detection threshold 325. At $t_2$, the second blanking period ends, drain-source voltage 321 is above slow detection threshold 325, and current 331 exceeds the nominal current magnitude 333. At $t_3$, the slow detection circuit determines a load short circuit fault is occurring and opens the semiconductor switch by removing gate voltage 311 applied to the semiconductor switch gate. In response to the removal of the gate voltage 311, current 331 decreases to zero.

With reference to FIG. 4, there is a plurality of graphs 400 illustrating electrical characteristics of a semiconductor switch during a phase leg short circuit fault. The plurality of graphs 400 includes graph 410 illustrating gate voltage, graph 420 illustrating drain-source voltage, and graph 430 illustrating current. Graph 410 includes a line representing gate voltage 411 and a gate voltage threshold 413. Graph 420 includes a line representing drain-source voltage 421, a fast detection threshold 423, and a slow detection voltage threshold 425. Graph 430 includes a line representing current 431 and a nominal current magnitude 433.

At $t_0$, a gate driver begins to apply an increasing gate voltage 411 to the semiconductor switch. Once gate voltage exceeds gate voltage threshold 413, current 431 begins to increase. Once gate voltage 413 reaches the Miller plateau, drain-source voltage 421 begins to decrease and the Miller capacitance begins to discharge. At $t_1$, the Miller capacitance is fully discharged and drain-source voltage 421 exceeds fast detection threshold 423. At $t_3$, the fast detection circuit determines a phase leg short circuit is occurring and opens the semiconductor switch by removing the gate voltage applied to the semiconductor gate. In response to the removal of the gate voltage 411, current 431 decreases to zero. At $t_2$, the second blanking period ends, the fast detection circuit having already responded to the determined phase leg short circuit fault.

As shown in graph 430, early detection of the phase leg fault during the second blanking period by the fast detection circuit enables a softer shutdown of the semiconductor switch during the fault response. By detecting the phase leg fault early in the second blanking period, the fast detection circuit reduces the thermal stresses of voltage transients generated by fault current spikes during semiconductor turn off.

Figure 5:
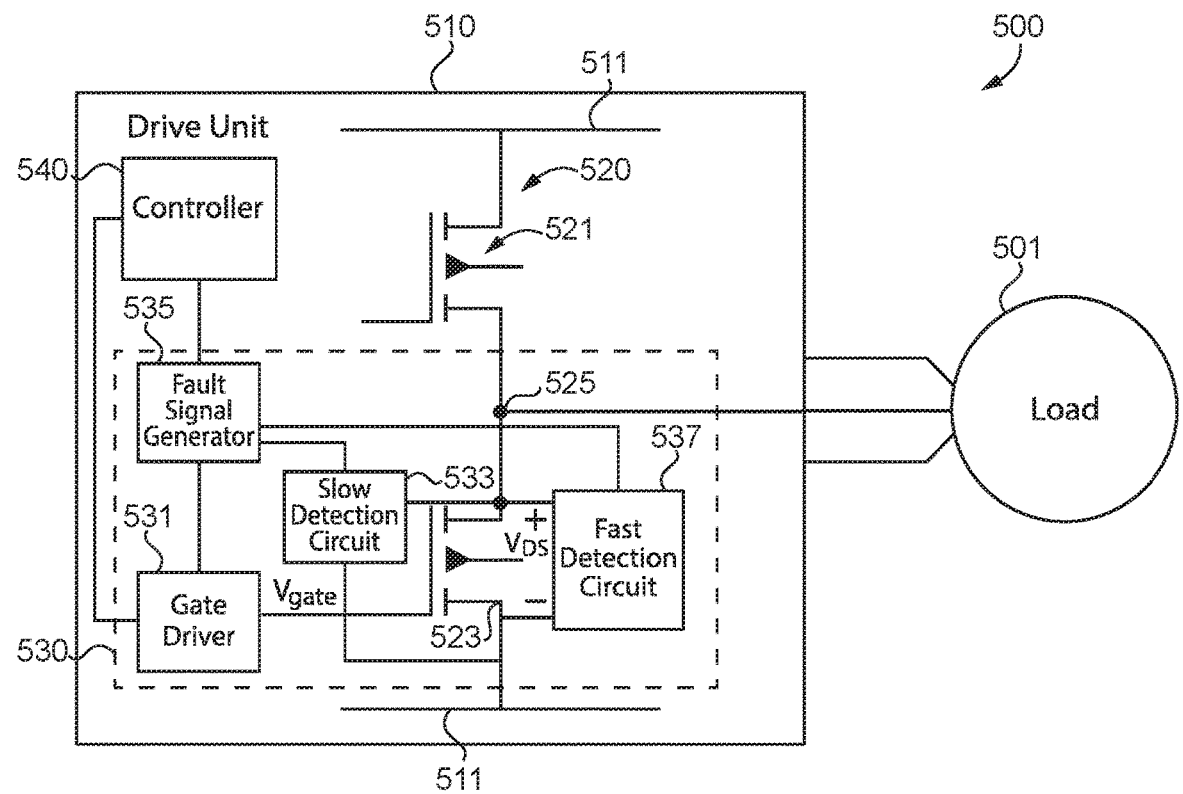
FIG. 5 illustrates a motor drive including an exemplary semiconductor control circuit.

With reference to FIG. 5 there is illustrated an exemplary machine system 500 including an exemplary semiconductor control circuit 530. It shall be appreciated that semiconductor control system 530 may be implemented in a variety of applications, including low voltage power converter systems, medium voltage power converter systems, motor drives, power distribution, and power converters, to name but a few examples. Semiconductor control system 530 is configured to execute an exemplary short circuit fault detection process, such as process 100 in FIG. 1. It shall be appreciated that the topology of system 500 is illustrated for the purpose of explanation and is not intended as a limitation of the present disclosure.

System 500 includes a load 501 coupled to a drive unit 510 structured to convert power and provide the converted power to load 501. Drive unit 510 includes phase leg 520, drive controller 540, and semiconductor control system 530. Phase leg 520 includes semiconductor switches 521 and 523 coupled between DC bus 511 at a midpoint connection 525. Load 501 is coupled to midpoint connection 525 and structured to receive power from phase leg 520 by way of midpoint connection 525.

Drive controller 540 is configured to coordinate operation of the semiconductor switches of drive unit 510 so as provide converted power to load 501. Drive controller 540 is structured to communicate with a gate driver 531 of semiconductor control system 530 and is structured to receive a fault signal from semiconductor control system 530.

Semiconductor control system 530 is structured to operate semiconductor switch 523 and protect semiconductor switch 523 from short circuit faults. In certain embodiments, semiconductor switch 523 includes a wide bandgap switch, such as SiC switch or a GaN switch, to name but a few examples. In certain embodiments, semiconductor switch 523 includes an insulated gate bipolar transistors (IGBTs), other bipolar semiconductor switches, or another type of silicon based semiconductor switch. System 530 includes a fast detection circuit 537, a slow detection circuit 533, gate driver 531, and a fault signal generator 535.

Gate driver 531 is structured to selectively provide a gate voltage to a gate of semiconductor 523 effective to turn on or turn off semiconductor 523 based on instructions or information received from controller 540 or fault signal generator 535. Fast detection circuit 537 is structured to detect a phase leg short circuit fault after the first blanking time. Slow detection circuit 533 is structured to detect a load short circuit fault after the second blanking time. Fault signal generator 535 is structured to receive a fault signal from circuit 533 or circuit 537, and output a fault signal to gate driver 531 effective to cause gate driver 531 to open semiconductor 523. Fault signal generator 535 is also structured to output a fault signal to drive controller 540 effective to cause controller 540 to stop providing power to load 501. In certain embodiments, one or more of fast detection circuit 537, a slow detection circuit 533, and gate driver 531, and a fault signal generator 535 are incorporated into gate driver 531.

Figure 6:
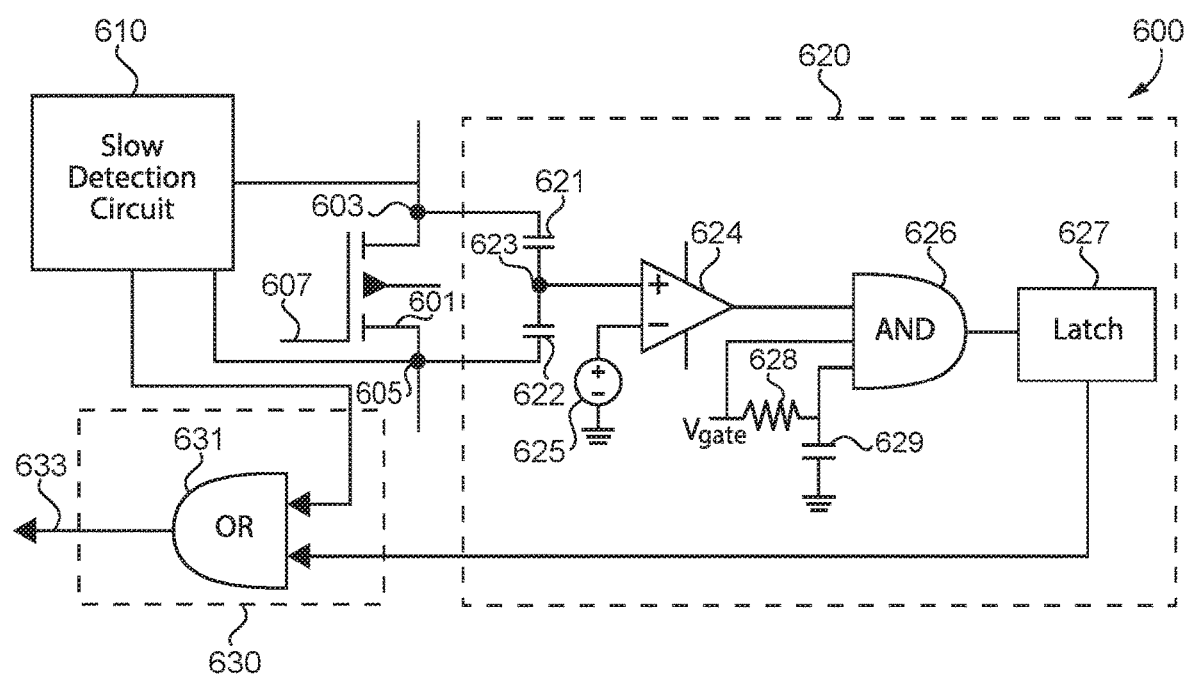
FIG. 6 illustrates an exemplary semiconductor control circuit portion.

It shall be appreciated that any or all of the foregoing features of system 500 may also be present in the other embodiments disclosed herein, such as semiconductor control circuit 600 in FIG. 6.

With reference to FIG. 6, there is illustrated a portion of an exemplary semiconductor control circuit 600 including fast detection circuit 620, slow detection circuit 610, and fault signal generator 630. Semiconductor control circuit 600 is structured to execute an exemplary short circuit fault protection process, such as process 100 in FIG. 1. In certain embodiments, control circuit 600 is configured to respond to a short circuit fault within 1 us using fast detection circuit 620. In certain embodiments, control circuit 600 is configured to respond to a short circuit fault within 0.25 us using fast detection circuit 620. It shall be appreciated that the topology of fast detection circuit 620 and fault signal generator 630 are illustrated for the purpose of explanation and is not intended as a limitation of the present disclosure.

Circuit 600 is structured to protect semiconductor switch 601 including a gate 607, a drain terminal 603, and a source terminal 605. In the illustrated embodiment, semiconductor switch 601 is a SiC MOSFET. In other embodiments, semiconductor switch 601 includes another type of wide bandgap device or a silicon based semiconductor, such as Si IGBT.

Slow detection circuit 610 may be any type of desaturation circuit configured to detect a short circuit fault after the second blanking period described above. In certain embodiments, slow detection circuit 610 does not detect a short circuit fault until 2 us after the beginning of the first blanking period.

Fast detection circuit 620 is structured to determine a short circuit fault is occurring using a received drain-source voltage. Fast detection circuit 620 includes a capacitive voltage divider coupled across the drain terminal 603 and source terminal 605, the capacitive voltage divider including capacitors 621 and 622 coupled at a midpoint connection 623. Capacitors 621 and 622 are structured such that the voltage at midpoint connection 623 corresponds proportionally to the drain-source voltage across terminals 603 and 605. In certain embodiments, a Zener diode is coupled in parallel with capacitor 622 in order to protect fast detection circuit 620 from high voltage transients. In certain embodiments, balancing resistors are coupled across each of capacitor 621 and capacitor 622 in order to ensure static voltage sharing.

A comparator 624 is coupled to midpoint connection 623 and structured to receive a voltage from midpoint connection 623. Comparator 624 is also coupled to a voltage source 625 structured to output a reference voltage corresponding to a fast detection threshold voltage. Since capacitors 621 and 622 are structured to reduce the voltage output to comparator, the reference voltage output by voltage source is also reduced, configured to correspond to a value of the drain-source voltage. For example, where the fast detection threshold voltage is 100 V and capacitors 621 and 622 are structured to reduce the drain-source voltage by a factor of 50, the reference voltage output by voltage source 625 is 2 V.

Comparator 624 is structured to compare the voltages received from midpoint connection 623 and voltage source 625. If the value of the voltage received from midpoint connection 623 is greater than the value of the reference voltage received from voltage source 625, comparator 624 outputs a high signal to an AND logic gate 626, the high signal indicating the existence of a fault.

AND logic gate 626 also receives input from a delay circuit structured to delay any output from gate 626 until the first blanking period ends. The delay circuit includes resistor 628 and capacitor 629, both structured to receive the gate voltage applied to gate 607. An output of AND gate 626 is coupled to a latch 627. An output of latch 627 is coupled to fault signal generator 630.

Fault signal generator 630 includes an OR gate 631 structured to receive input from slow detection circuit 610 and latch 627. If either the slow detection circuit 610 or fast detection circuit 620 determine a short circuit fault is occurring, OR gate 631 will receive a high signal input, causing the OR gate 631 to transmit a fault signal 633 from an OR gate 631 output. The OR gate 631 output may be coupled to the gate driver for semiconductor switch 601, or a power converter controller for a power converter including semiconductor switch 601. It shall be appreciated that any or all of the foregoing features of circuit 600 may also be present in the other semiconductor control circuits disclosed herein.

Further written description of a number of exemplary embodiments shall now be provided. One embodiment is a method for protecting a semiconductor switch comprising: receiving a first voltage during a second blanking period following a first blanking period, the first blanking period beginning when an increasing gate voltage is applied to the semiconductor switch and ending when the semiconductor switch is turned on; determining whether a short circuit fault is occurring by comparing the first voltage to a fast detection threshold corresponding to a first value of a drain-source voltage of the semiconductor switch; if it is not determined that a short circuit is occurring: receiving a second voltage after the second blanking period ends; determining whether a short circuit fault is occurring by comparing the second voltage to a slow detection threshold corresponding to a second value of the drain-source voltage; and if it is determined a short circuit fault is occurring, opening the semiconductor switch, wherein the first value of the drain-source voltage is greater than the second value of the drain-source voltage.

In certain forms of the foregoing method, the semiconductor switch is a wide bandgap device. In certain forms, opening the semiconductor switch occurs within 1 us of the beginning of the first blanking period. In certain forms, the method comprises generating the first voltage using a capacitive voltage divider coupled to a drain of the semiconductor switch and a source of the semiconductor switch. In certain forms, the fast detection threshold is at least 5% of a blocking voltage of the semiconductor switch or wherein the fast detection threshold is at least five times greater than the slow detection threshold. In certain forms, the method comprises receiving a third voltage during the first blanking period; and determining whether a short circuit fault is occurring by comparing the third voltage to a third detection threshold corresponding to a third value of the drain-source voltage, wherein the third value of the drain-source voltage is greater than the first value of the drain-source voltage. In certain forms, comparing the first voltage to a fast detection threshold corresponding to a first value of a drain-source voltage of the semiconductor switch determines whether a phase leg short circuit fault is occurring and comparing the second voltage to a slow detection threshold corresponding to a second value of the drain-source voltage determines whether a load short circuit is occurring.

Another exemplary embodiment is a semiconductor control system for a semiconductor switch comprising: a fast detection circuit structured to: receive a first voltage during a second blanking period following a first blanking period, the first blanking period beginning when an increasing gate voltage is applied to the semiconductor switch, the first blanking period ending when the semiconductor switch is turned on, and determine whether a short circuit fault is occurring by comparing the first voltage to a fast detection threshold corresponding to a first value of a drain-source voltage of the semiconductor switch; and a slow detection circuit structured to perform the following if the fast detection circuit does not determine a short circuit fault is occurring: receive a second voltage after the second blanking period ends; determine whether a short circuit fault is occurring by comparing the second voltage to a slow detection threshold corresponding to a second value of the drain-source voltage, wherein the semiconductor control system is structured to open the semiconductor switch in response to either the fast detection circuit or the slow detection circuit determining a short circuit fault is occurring, and wherein the first value of the drain-source voltage is greater than the second value of the drain-source voltage.

In certain forms of the foregoing semiconductor control system, the semiconductor switch is a silicon carbide switch or a gallium nitride switch. In certain forms, opening the semiconductor switch occurs within 1 us of the beginning of the first blanking period. In certain forms, the fast detection circuit includes a capacitive voltage divider coupled to a drain of the semiconductor switch and a source of the semiconductor switch. In certain forms, the fast detection threshold is at least 5% of a blocking voltage of the semiconductor switch. In certain forms, the fast detection threshold is at least five times greater than the slow detection threshold. In certain forms, the fast detection circuit determines whether a phase leg short circuit fault is occurring and the slow detection circuit determines whether a load short circuit is occurring.

A further exemplary embodiment is a power converter system comprising: a semiconductor switch; a fast detection circuit structured to: during a second blanking period, receive a first voltage, the second blanking period following a first blanking period, the first blanking period beginning when an increasing gate voltage is first applied to the semiconductor switch, the first blanking period ending when the semiconductor switch is turned on, and determine whether a phase leg short circuit fault is occurring by comparing the first voltage to a fast detection threshold corresponding to a first value of a drain-source voltage of the semiconductor switch; and a slow detection circuit structured to perform the following if the fast detection circuit does not determine a phase leg short circuit fault is occurring: receive a second voltage after the second blanking period ends; determine whether a load short circuit fault is occurring by comparing the second voltage to a slow detection threshold corresponding to a second value of the drain-source voltage, wherein the power converter system is structured to open the semiconductor switch in response to determining a phase leg short circuit fault is occurring or a load short circuit is occurring, and wherein the first value of the drain-source voltage is greater than the second value of the drain-source voltage.

In certain forms of the foregoing power converter system, the semiconductor switch is a silicon carbide switch or a gallium nitride switch. In certain forms, opening the semiconductor switch occurs within 1 us of the beginning of the first blanking period. In certain forms, the fast detection circuit includes a capacitive voltage divider coupled to a drain of the semiconductor switch and a source of the semiconductor switch. In certain forms, the fast detection threshold is at least 5% of a blocking voltage of the semiconductor switch. In certain forms, the fast detection threshold is at least five times greater than the slow detection threshold.

It is contemplated that the various aspects, features, processes, and operations from the various embodiments may be used in any of the other embodiments unless expressly stated to the contrary. Certain operations illustrated may be implemented by a computer including a processing device executing a computer program product on a non-transient, computer-readable storage medium, where the computer program product includes instructions causing the processing device to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection $t_o$, another item, as well as a belonging $t_o$, or a connection with, the other item as informed by the context in which it is used. The terms "coupled $t_o$," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary.

What is claimed is:

1. A method for protecting a semiconductor switch comprising:
   receiving a first voltage during a second blanking period following a first blanking period, the first blanking period beginning when an increasing gate voltage is applied to the semiconductor switch and ending when the semiconductor switch is turned on;
   determining whether a short circuit fault is occurring by comparing the first voltage to a fast detection threshold corresponding to a first value of a drain-source voltage of the semiconductor switch;
   if it is not determined that a short circuit is occurring:
   receiving a second voltage after the second blanking period ends;
   determining whether a short circuit fault is occurring by comparing the second voltage to a slow detection threshold corresponding to a second value of the drain-source voltage; and
   if it is determined a short circuit fault is occurring, opening the semiconductor switch, wherein the first value of the drain-source voltage is greater than the second value of the drain-source voltage;

receiving a third voltage during the first blanking period; and determining whether a short circuit fault is occurring by comparing the third voltage to a third detection threshold corresponding to a third value of the drain-source voltage, wherein the third value of the drain-source voltage is greater than the first value of the drain-source voltage.

2. The method of claim 1, wherein the semiconductor switch is a wide bandgap device.

3. The method of claim 1, wherein opening the semiconductor switch occurs within 1 μs of the beginning of the first blanking period.

4. The method of claim 1, comprising generating the first voltage using a capacitive voltage divider coupled to a drain of the semiconductor switch and a source of the semiconductor switch.

5. The method of claim 1, wherein the fast detection threshold is at least 5% of a blocking voltage of the semiconductor switch or wherein the fast detection threshold is at least five times greater than the slow detection threshold.

6. The method of claim 1, wherein comparing the first voltage to a fast detection threshold corresponding to a first value of a drain-source voltage of the semiconductor switch determines whether a phase leg short circuit fault is occurring and comparing the second voltage to a slow detection threshold corresponding to a second value of the drain-source voltage determines whether a load short circuit is occurring.

7. A semiconductor control system for a semiconductor switch comprising:
a fast detection circuit structured to:
receive a first voltage during a second blanking period following a first blanking period, the first blanking period beginning when an increasing gate voltage is applied to the semiconductor switch, the first blanking period ending when the semiconductor switch is turned on, and
determine whether a short circuit fault is occurring by comparing the first voltage to a fast detection threshold corresponding to a first value of a drain-source voltage of the semiconductor switch; and
a slow detection circuit structured to perform the following if the fast detection circuit does not determine a short circuit fault is occurring:
receive a second voltage after the second blanking period ends;
determine whether a short circuit fault is occurring by comparing the second voltage to a slow detection threshold corresponding to a second value of the drain-source voltage,
wherein the semiconductor control system is structured to open the semiconductor switch in response to either the fast detection circuit or the slow detection circuit determining a short circuit fault is occurring, and
wherein the first value of the drain-source voltage is greater than the second value of the drain-source voltage;
receiving a third voltage during the first blanking period; and
determining whether a short circuit fault is occurring by comparing the third voltage to a third detection threshold corresponding to a third value of the drain-source voltage, wherein the third value of the drain-source voltage is greater than the first value of the drain-source voltage.

8. The semiconductor control system of claim 7, wherein the semiconductor switch is a silicon carbide switch or a gallium nitride switch.

9. The semiconductor control system of claim 7, wherein opening the semiconductor switch occurs within 1 μs of the beginning of the first blanking period.

10. The semiconductor control system of claim 7, wherein the fast detection circuit includes a capacitive voltage divider coupled to a drain of the semiconductor switch and a source of the semiconductor switch.

11. The semiconductor control system of claim 7, wherein the fast detection threshold is at least 5% of a blocking voltage of the semiconductor switch.

12. The semiconductor control system of claim 7, wherein the fast detection threshold is at least five times greater than the slow detection threshold.

13. The semiconductor control system of claim 7, wherein the fast detection circuit determines whether a phase leg short circuit fault is occurring and the slow detection circuit determines whether a load short circuit is occurring.

14. A power converter system comprising:
a semiconductor switch;
a fast detection circuit structured to:
during a second blanking period, receive a first voltage, the second blanking period following a first blanking period, the first blanking period beginning when an increasing gate voltage is first applied to the semiconductor switch, the first blanking period ending when the semiconductor switch is turned on, and
determine whether a phase leg short circuit fault is occurring by comparing the first voltage to a fast detection threshold corresponding to a first value of a drain-source voltage of the semiconductor switch; and
a slow detection circuit structured to perform the following if the fast detection circuit does not determine a phase leg short circuit fault is occurring:
receive a second voltage after the second blanking period ends;
determine whether a load short circuit fault is occurring by comparing the second voltage to a slow detection threshold corresponding to a second value of the drain-source voltage,
wherein the power converter system is structured to open the semiconductor switch in response to determining a phase leg short circuit fault is occurring or a load short circuit is occurring, and
wherein the first value of the drain-source voltage is greater than the second value of the drain-source voltage;
receiving a third voltage during the first blanking period; and
determining whether a short circuit fault is occurring by comparing the third voltage to a third detection threshold corresponding to a third value of the drain-source voltage,
wherein the third value of the drain-source voltage is greater than the first value of the drain-source voltage.

15. The power converter system of claim 14, wherein the semiconductor switch is a silicon carbide switch or a gallium nitride switch.

16. The power converter system of claim 14, wherein opening the semiconductor switch occurs within 1 us of the beginning of the first blanking period.

17. The power converter system of claim 14, wherein the fast detection circuit includes a capacitive voltage divider coupled to a drain of the semiconductor switch and a source of the semiconductor switch.

18. The power converter system of claim 14, wherein the fast detection threshold is at least 5% of a blocking voltage of the semiconductor switch.

19. The semiconductor control system of claim 14, wherein the fast detection threshold is at least five times greater than the slow detection threshold.

\* \* \* \* \*